United States Patent [19]

van de Sande

[11] Patent Number: 4,668,924

[45] Date of Patent: May 26, 1987

[54] FREE ELECTRON DIODE OSCILLATOR

[75] Inventor: Brett D. van de Sande, Neptune, N.J.

[73] Assignee: The United States of America as represented by the Secretary of the Army, Washington, D.C.

[21] Appl. No.: 897,692

[22] Filed: Aug. 19, 1986

[51] Int. Cl.[4] .......................... H01J 25/50; H03B 9/10

[52] U.S. Cl. ........................................ 331/86; 315/39; 331/101

[58] Field of Search ........................ 331/86, 87, 88, 90, 331/91, 101; 315/39, 39.51, 39.53

[56] References Cited

U.S. PATENT DOCUMENTS 2,782,341 2/1957 Gamble et al. ....................... 315/39

*Primary Examiner*—Siegfried H. Grimm
*Attorney, Agent, or Firm*—Sheldon Kanars; Jeremiah G. Murray; John T. Rehberg

[57] ABSTRACT

A crossed-field microwave power tube. Electrons are emitted from a tubular electrode at ground potential. The electrons are accelerated by an electric field toward a high voltage anode located within the tubular electrode. A magnetic field is oriented along the axis of the tube; the magnetic field is perpendicular to the electric field. The electrons follow curved paths in the space between the tubular electrode and the anode, while producing electromagnetic radiation in a TEM mode. The TEM radiation is easily coupled from the tube.

7 Claims, 3 Drawing Figures

FREE ELECTRON DIODE OSCILLATOR

The invention described herein may be manufactured, used and licensed by or for the Government without payment to me of any royalty thereon.

BACKGROUND OF THE INVENTION

1. Field of the Invention

This invention relates generally to microwave power sources and more particularly to microwave tubes which utilize crossed electric and magnetic fields during operation.

2. Description of the Prior Art

The most common varieties of microwave power tubes are classified as either linear beam tubes or crossed-field tubes. Linear beam tubes feature electric and magnetic fields which are parallel to one another. The magnetron is a popular, well-known example of a crossed-field tube. In the magnetron and other crossed-field tubes a DC electric field is oriented perpendicular to a constant magnetic field. Typically, a high magnetic field, on the order of 1000–3000 Gauss is employed. Thermionic electrons, moving under the influence of perpendicular electric and magnetic fields, induce RF radiation in a plurality of resonant cavities. The RF radiation is excited by angular bunching of the electrons. Radiation is extracted from one of the cavities to power an antenna, warm leftovers, etc. Control of the modes excited in the various magnetron cavities has always presented a problem for the designer. Strapping of adjacent cavities provides some control over the modes of oscillation. However, the fundamental laws of electrodynamics require that transverse electromagnetic modes (TEM) cannot exist in the magnetron's resonant cavities. Consequently, some care must be used in coupling the magnetron's output power if a TEM output into, for example, a coaxial transmission line, is desired.

SUMMARY OF THE INVENTION

It is an object of the present invention to provide a simple, compact crossed-field microwave power tube.

It is another object of the present invention to provide a microwave power tube which does not require a plurality of resonant cavities for effective operation.

A further object of the present invention is to provide an RF power source capable of directly producing transverse electromagnetic (TEM) radiation.

A still further object of the present invention is to provide a crossed-field microwave tube which requires a relatively low magnetic field for its operation.

The present invention features a tubular electrode tube at ground potential. The tube may be either cylindrical or conical. A concentric high voltage anode wire is located inside the tubular electrode along its axis. A magnetic field is oriented along the common axes of the anode wire and tubular electrode. A source of electrons, for example, a wire filament, or an electron gun is located in a window in the side wall of the cylindrical or conical electrode. Electrons emitted from the source accelerate toward the wire anode under the influence of the potential difference between the anode and the electrode. The Lorentz force created by the combination of electric and magnetic fields between the electrode and the anode prevents the electrons from actually hitting the anode. The electrons curve past the anode and decelerate as they approach the opposite side of the electrode. Then the electrons turn and re-accelerate toward the anode, curve past the anode and decelerate as they reach the side from which they were emitted and then the oscillations repeat. Microwave or RF energy is produced by the electron oscillations in the region between the anode and the tubular electrode of the tube. In contrast with the magnetron, where, as already mentioned, the radiation is excited by angular bunching of the electrons, in the present invention, radiation is induced by radial bunching of the electrons.

If the anode and electrode are considered the inner and outer conductors of a coaxial cable, the microwave or RF fields produced by the electron oscillations couple to the dominant or TEM mode of the cable. Consequently, coupling of the radiation produced by the tube is simple and efficient.

Because of space-charge effects (i.e. electron-electron repulsion) the electrons tend to migrate along the axis of the tube. Ultimately, the electrons are absorbed by a collector positioned at the end of the anode.

Adjustment of both the magnetic field and anode voltage provides broadband operation.

BRIEF DESCRIPTION OF THE DRAWINGS

Further objects and advantages of the present invention will become become apparent to those familiar with the art upon examination of the following detailed description and accompanying drawings.

DETAILED DESCRIPTION OF THE PREFERRED EMBODIMENTS

Figure 1:
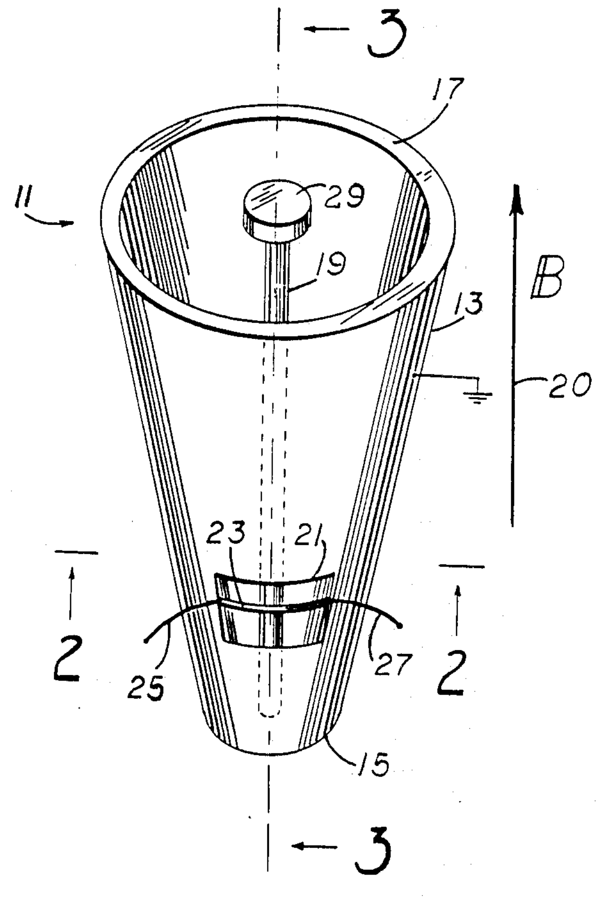
FIG. 1 is a perspective view of a preferred embodiment of the present invention.

Referring to the drawings, and particularly to FIG. 1, wherein like numerals refer to like components throughout, reference numeral 11 designates generally the inventive device. Reference numeral 13 designates a tubular electrode at ground potential. The electrode may be either cylindrical or conical. In one preferred embodiment of the present invention, with a cylindrical electrode, the electrode 13 has an inner diameter of $\frac{3}{4}$ in. As will be described further below, other preferred embodiments utilize a conical-shaped electrode 13. In such a preferred embodiment the smaller inner diameter 15 of the conical-shaped electrode is $\frac{1}{4}$ in., while the larger inner diameter 17 of the conical electrode is $\frac{3}{4}$ in. The length of the tube is not critical, but the length should be at least equal to the tube diameter (or larger diameter if a conical tube is used). In one preferred embodiment the tube length is $3\frac{1}{2}$ in.

A concentric anode wire 19 is located inside the electrode 13 and the wire 19 extends the entire length of the electrode 13. The wire may be made of molybdenum and have a diameter of 0.020 in. Typically, the anode is at a voltage of 2000–4000 VDC. A magnetic field 20 is oriented parallel to the anode 19. It does not matter whether the magnetic field points upwards or downwards (i.e. if a conical electrode is used, it does not matter whether the field points toward the large diameter end or the small diameter end). A representative magnetic field magnitude is 54 Gauss. The field is provided by a coil outside the electrode. At least one window 21 is cut in the side of electrode 13. If electrode 13 is conical-shaped, the window 21 is located near the small-diameter end 15. A filament 23, for example, thoriated tungsten, is positioned within window 21. Two windows with respective filaments may be located 180 apart if desired. The filament 23 is connected by leads 25 and 27 to a DC power supply. In a preferred embodiment of the present invention, application of a DC current of 1.8 amperes causes the filament 23 to emit electrons which move toward the anode 19. The anode 19 should extend a sufficient distance below the window 21 so that a uniform electric field is provided for the thermionic electrons.

Figure 2:
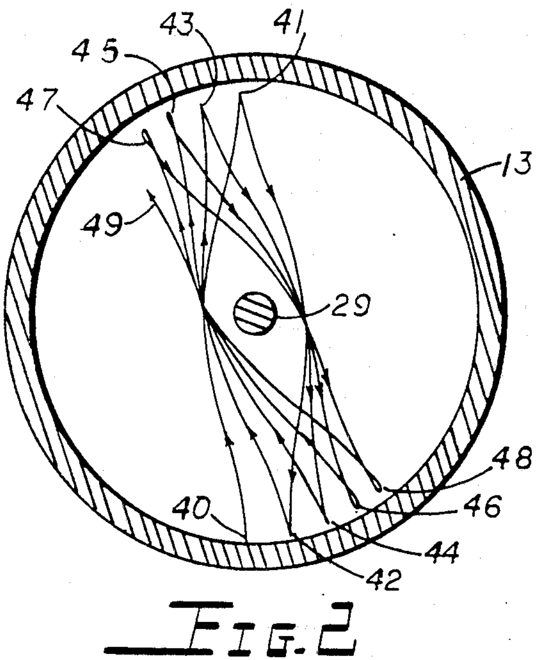
FIG. 2 is an enlarged cross sectional view of the device of FIG. 1, cut along the line 2—2 and looking in the direction of the arrows.

The behavior of an individual electron moving under the influence of the electric and magnetic fields is illustrated in FIG. 2 which contains a computer simulation of a portion of a typical electron trajectory viewed in a representative cross-section of the tube. Vertices (i.e. turning points) of the trajectory are indicated by reference numerals 40–49. The electron is assumed to start at a point designated by reference number 40, proceed past the anode 19 (without hitting the anode) to a point designated by reference numeral 41, thence past anode 19 again to the point designated by reference numberal 42, and so on through the points designated by reference numberals 43–49. For simplicity, the trajectory illustrated in FIG. 2 is, of course, only a portion of the complete electron trajectory.

It should be noted that several of the vertices, e.g. designated by reference numerals 45–48, exhibit a looped retrograde electron trajectory. Each of the aforementioned vertices contains a small loop at its extremity. Such a retrograde trajectory is characteristic of electron motion when the proper ratio of magnetic and electric fields is not achieved; in the example of FIG. 2, the electron will eventually hit the anode wire 19.

There are specific combinations of electric and magnetic fields which will permit the electron to return to its starting point 40, and then re-traverse the same trajectory. Such combinations of electric and magnetic fields produce stable electron trajectories—essential for proper device operation and production of RF or microwave power. Perturbation of either of the fields required to establish steady state operation will cause the electron's trajectory to degenerate and eventually strike the anode.

Consistent with practice in the power tube art, the device is surrounded by a vacuum envelope (not shown); the device is operated at a pressure of $10^{-7}$ Torr.

Space-charge effects (i.e. electron-electron repulsion) cause the electrons to migrate along the axis of the electrode toward a collector 29. In a preferred embodiment, the collector 29 is chrome or molybdenum wire wrapped around the end of the anode 19. RF energy, in the TEM mode may be coupled from the device at end 17 by matching techniques known to those skilled in the art.

As mentioned before, the electrode may be either cylindrical or conical in shape. It has been determined that a conical electrode provides greater efficiency.

A better understanding of the operation of the device may be gained from the following theoretical analysis: The motion of an individual electron is prescribed in general by the Lorentz force law, viz.:

$$F = ma = e(E + v \times B) \qquad (1)$$

where

F = force on the electron
m = mass of electron
a = acceleration
E = electric field
v = velocity of electron
B = magnetic field If the voltage of the anode is V, and $r_o$ is the electrode inner radius and $r_i$ is the anode radius, and the electron's charge to mass ratio is $\eta$, the Lorentz force equation above may be rewritten in rectangular coordinates as:

$$\ddot{x} = -\eta\left[\frac{V}{r\ln\frac{r_o}{r_i}}\cdot\frac{x}{r} + \dot{y}B\right] \qquad (2)$$

$$\ddot{y} = -\eta\left[\frac{V}{r\ln\frac{r_o}{r_i}}\cdot\frac{y}{r} - \dot{x}B\right] \qquad (3)$$

where $r^2 = x^2 + y^2$ and $\nu_i \leqq \nu \leqq \nu_o$ and $$\frac{V}{r\ln\frac{r_o}{r_i}} = E$$

Figure 3:
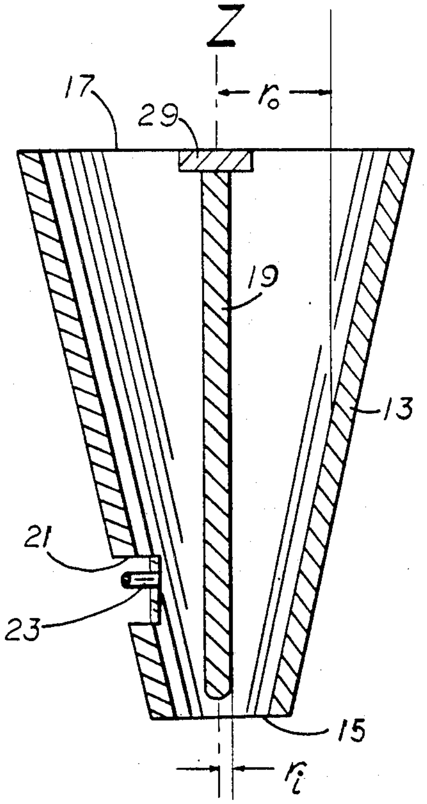
FIG. 3 is a cross sectional view of the device of FIG. 1, cut along the line 3—3 and looking in the direction of the arrows.

Equations (2) and (3) presume that the Z-axis extends along the axis of the tubular electrode. If the electrode is conical in shape, the analysis is still appropriate for any particular cross-section in any plane parallel to FIG. 2. However, r is not constant and must be considered a function of Z, the axial coordinater i.e. $\nu_o = \nu_o(Z)$ see FIG. 3.

If the magnetic field were turned off, i.e. B=0, a relationship between the frequency of the electron's oscillation and the device geometry may be obtained. The equations of motion, when B=0, reduce to:

$$\ddot{r} = -\left[\frac{\eta V}{\ln\frac{r_o}{r_i}}\right]\cdot\frac{1}{r} \qquad (4)$$

letting $C_1 = \dfrac{\eta V}{\ln\frac{r_o}{r_i}}$ and integrating, $$\dot{r} = -\sqrt{-2C_1\ln r + C_2} \qquad (5)$$

where $C_2$ is a constant.

Since $\dot{\nu}=0$ when $\nu=\nu_m$ where $\nu_m$ is the maximum radial distance of the electron from the center, (in the conical embodiment, $\nu_m$ is a function of z; i.e. $\nu_m=\nu_m(Z)$ the solution is:

$$\dot{\nu} = \sqrt{-2C_1 \ln \nu/\nu_m} \qquad (6)$$

Now substituting $R=\nu/\nu_m$ and $w=\sqrt{-\ln R}$ (and therefore, $e^{-w^2}=R$ and $-2we^{-w^2}dw=dR$ the above equation may be rewritten as:

$$\nu = \sqrt{2C_1}\,W \qquad (7)$$

Integrating from $\nu=\nu_m$ to $\nu=0$:

$$r_m \int_0^1 \frac{dR}{\sqrt{-\ln R}} = \int_o^t \sqrt{2C}\, dt \text{ or} \quad (8)$$

$$2\int_0^{+\infty} e^{-w^2} dw = \frac{t}{r_m}\sqrt{2C} \quad (9)$$

Since t is the time for one-half an electron's oscillation, the frequency of oscillation is given by:

$$\text{frequency} = \frac{1}{2t} = \frac{1}{2r_m}\sqrt{\frac{2\eta V}{\pi \ln \frac{r_o}{r_i}}} \quad (10)$$

Steady-state oscillation is achieved at a frequency equal to that given above multiplied by a constant:

$$\text{frequency} = \frac{\Omega}{r_m}\sqrt{\frac{\eta V}{2\pi \ln \frac{r_o}{r_i}}} \quad (11)$$

Computer-aided simulation provides an estimate of the value of Ω, viz.

$$\Omega = 0.95169194$$

In order to analyze behaviour of the device more completely, the magnetic field terms must be considered, and the equations of motion, written above in Cartesian coordinates, may also be rewritten in polar coordinates:

$$\ddot{r} - r\dot{\theta}^2 = -\eta\left[\frac{E}{r} + r\dot{\theta}B\right] \quad (12)$$

$$r\ddot{\theta} + 2\dot{r}\dot{\theta} = \eta\dot{r}B \quad (13)$$

The above equations include the effects of the magnetic field, B.

The second equation may be integrated directly:

$$\dot{\theta} = \frac{\eta B}{2}\left(1 - \frac{r_m^2}{r^2}\right) \quad (14)$$

(the integration constant being chosen so that $\nu=\nu_m$ when $\theta=0$). Substitution of the above result into the first equation of motion, and integrating:

$$\frac{\dot{r}^2}{-2\eta} = E\ln\frac{r}{\sigma} + \frac{\eta B^2}{8}\left(r^2 - \sigma^2 + \frac{r_m^4}{r^2} - \frac{r_m^4}{\sigma^2}\right) \quad (15)$$

where $\sigma$ is the minimum electron radius, i.e. when $\nu=\sigma$, the constant of integration is chosen so that $\nu=0$.

Now, defining Φ as the ratio of the minimum electron radius to the maximum electron radius, or $\Phi=\sigma/\nu_m$, we may write:

$$\frac{-\ln\Phi}{(\Phi - 1/\Phi)^2} = \frac{\eta^2 B^2 r_m \ln r_o/r_i}{8V} \quad (16)$$

Again, computer aided simulation provides a value of 0.20888 for Φ for stable or steady state oscillations.

To effect a complete mathematical description of the conditions for steady state oscillation the aforementioned results in equations (11) and (16) may be combined:

$$K = r_m^2 \ln\left(\frac{r_o}{r_i}\right) = \frac{-\ln\Phi \cdot 8V}{\left(\Phi - \frac{1}{\Phi}\right)^2 \eta B^2} = \frac{\Omega^2 \eta V}{2\pi \times (\text{frequency})^2} \quad (17)$$

where K is a constant.

The dependence of output frequency upon the anode voltage and magnetic field may be determined from equation 17 as follows: The quantity $K=\nu_m^2 \ln(\nu_o/\nu_i)$ is a constant which depends upon device geometry, and K may be calculated for any cylindrical or conical electrode. Using (17):

$$K = r_m^2 \ln\left(\frac{r_o}{r_i}\right) = \frac{\Omega^2 \eta V}{2\pi \times (\text{frequency})^2} \quad (18)$$

provides the required anode voltage, v for any desired frequency. And $$\frac{-\ln\Phi \cdot 8V}{(\Phi - 1/\Phi)^2 \eta B^2} = \frac{\Omega\, \eta\, V}{2\pi \times (\text{frequency})^2} \quad (19)$$

provides the required magnetic field for given frequency and voltage.

Thus, by adjustment of both electric and magnetic fields, a range of output frequencies may be obtained.

The illustrative embodiments herein are merely a few of those possible variations which will occur to those skilled in the art while using the inventive principles contained herein. Accordingly, numerous variations of the invention are possible while staying within the spirit and scope of the invention as defined in the following claims.

What is claimed is:

1. An electromagnetic radiation generator comprising:

a grounded, tubular electrode having an axis extending therethrough;

a high-voltage anode located concentrically within said electrode and extending along said axis;

means for generating a magnetic field directed along said axis;

an electron source for generating electrons interior to said electrode, whereby said electrons move under the influence of said high voltage and said magnetic field and produce electromagnetic radiation.

2. The device recited in claim 1 wherein said tubular electrode is conical.

3. The device recited in claim 1 wherein said tubular electrode is cylindrical.

4. The device cited in claim 1 wherein said high-voltage anode further includes an electron collector.

5. The device recited in claim 1 wherein said tubular electrode has at least one window in its side wall for admitting said electrons to said interior.

6. The device recited in claim 5 wherein said electron source is a filament extending across said window.

7. An electromagnetic radiation generator comprising:

an evacuated, grounded conical electrode having an axis extending therethrough and having a side with at least one window;

a high voltage anode concentric within said electrode;

means for generating a magnetic field directed along said axis;

a filament within said window; and means for producing a current within said filament whereby electrons are emitted from said filament and travel interior to said electrode under the influence of said high voltage and said magnetic field to produce TEM electromagnetic radiation.

* * * * *